United States Patent [19]

Zaslav

[11] 4,002,932
[45] Jan. 11, 1977

[54] PULSE MODULATOR GATING CIRCUIT WITH TRAILING EDGE CONTROL
[75] Inventor: Harold Zaslav, Anaheim, Calif.
[73] Assignee: Hughes Aircraft Company, Culver City, Calif.
[22] Filed: Oct. 2, 1975
[21] Appl. No.: 620,478
[52] U.S. Cl. .............................. 307/265; 307/314; 307/316; 332/12; 307/270
[51] Int. Cl.² ..................................... H03K 17/00
[58] Field of Search .................. 307/270, 314, 316; 340/174 AC, 254, 265, 266; 332/9 T, 12

[56] References Cited
UNITED STATES PATENTS

| | | | |
|---|---|---|---|
| 3,478,223 | 11/1969 | Perschy | 307/270 |
| 3,754,274 | 8/1973 | Auger | 307/270 |
| 3,928,809 | 12/1975 | Tschudi et al. | 307/314 |

Primary Examiner—Stanley D. Miller, Jr.
Assistant Examiner—B. P. Davis
Attorney, Agent, or Firm—Lawrence V. Link, Jr.; W. H. MacAllister

[57] ABSTRACT

Herein disclosed is a new and improved pulse modulator comprising first current gating means for applying a current through a first primary lead of a current transformer during the duration of an applied control signal pulse and second current gating means for applying an oppositely directed current through a second primary lead of the transformer. The current flow through the second primary lead commences at the trailing edge of the control signal pulse and produces a flux which cancels the flux produced by the current through the first primary lead; whereby a high voltage output pulse is produced across the secondary winding of the transformer which accurately reproduces the duration of the applied low voltage control signal pulse.

10 Claims, 2 Drawing Figures

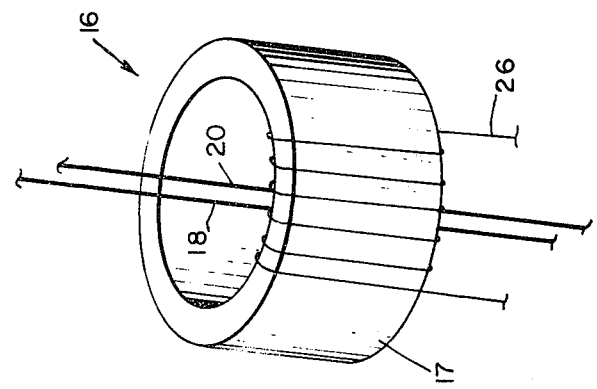
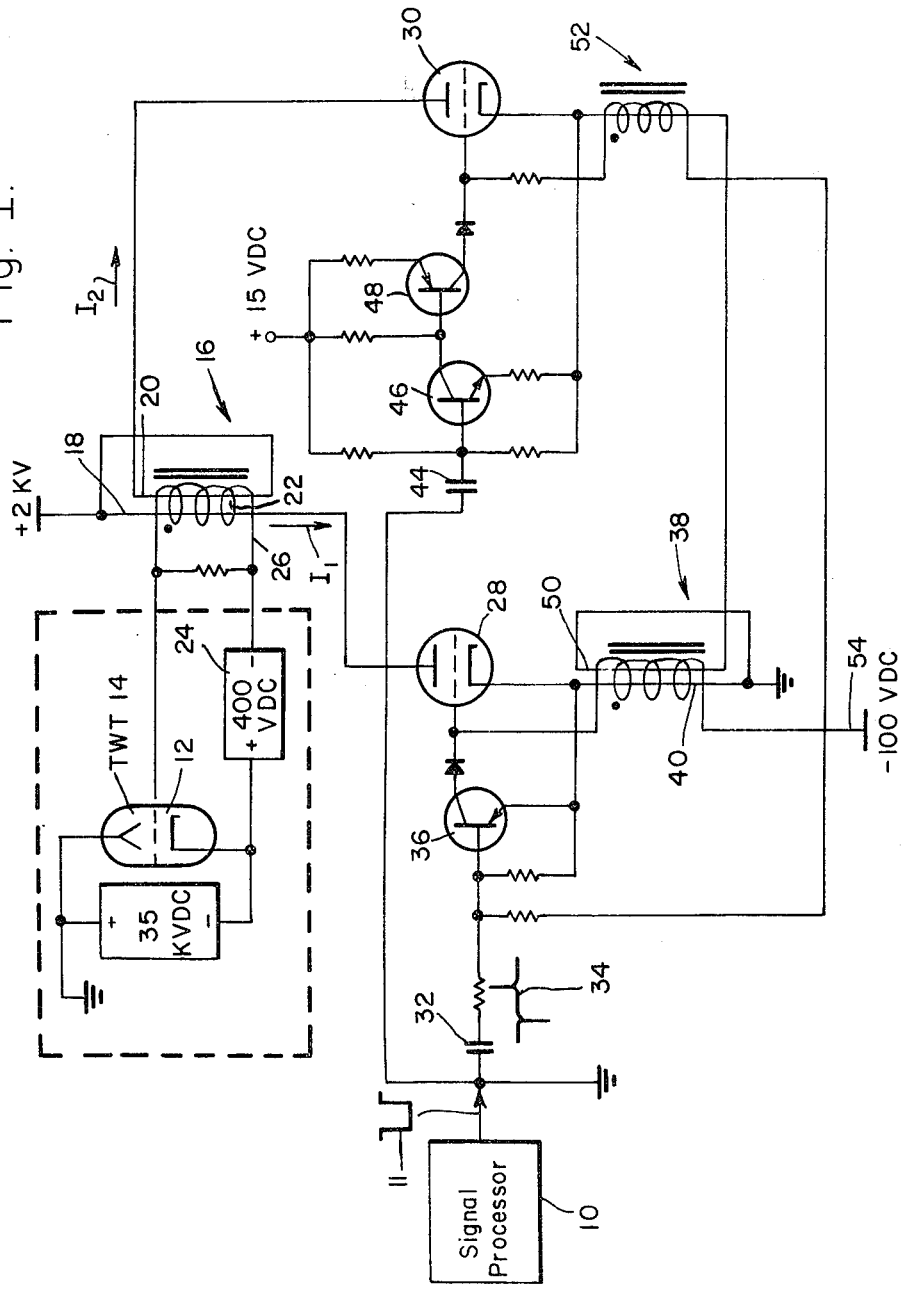

4,002,932

PULSE MODULATOR GATING CIRCUIT WITH TRAILING EDGE CONTROL

The invention claimed herein was made in the course of or under a contract with the United States Navy.

BACKGROUND OF THE INVENTION

This invention relates generally to pulse modulator circuits and is particularly adapted for grid control of traveling wave tubes (TWT).

Many modern pulse type radar transmitters use grid controlled TWT radio frequency amplifiers in a configuration such that the grid of the TWT is at a potential of from 35,000 to 100,000 volts with respect to ground. Further, it is desired that the width of the pulse applied to the grid of the TWT be substantially the same as that of a low level pulse supplied from a radar signal processor. Of the several types of TWT grid pulse modulators presently in use many implement ON and OFF switching arrangements at the high voltage level of the TWT. As could be anticipated such arrangements are relatively complex to mechanize and have inherent reliability problems.

Further, such direct coupled pulse modulators have problems producing a pulse with a fast trailing edge. To alleviate this problem prior modulators have incorporated "tail biter" circuits. Said last mentioned circuits normally operate by shorting the output of the pulse modulator to ground at the time when it is desired to terminate the pulse; and although such an approach is effective in decreasing the fall time of the trailing edge of the pulse, if timing misalignment occurs in the circuit considerable energy is shorted to ground and the life of the pulse modulator can be substantially reduced.

Also, it has been Applicant's experience that prior art direct coupled modulators which contain complex semiconductor circuitry operating at the high voltage potentials of TWT circuits suffer from reliability problems since they are vulnerable to TWT arcing and high voltage power supply "crowbarring".

SUMMARY OF THE INVENTION

It is therefore a primary object of the subject invention to provide improved pulse modulators.

A more particular object of the invention is to provide a pulse modulator which is capable of high reliability operation in radar transmitter type applications.

A further object of the invention is to provide a high voltage type pulse modulator of reduced complexity and improved reliability.

According to one preferred embodiment of the subject invention, a first current gating means applies a first current through a first primary lead of current transformer during the duration of an applied control signal pulse; and a second current gating means applies a second current through a second primary lead of the output transformer. The current flow through the second primary lead commences with the trailing edge of the applied control signal pulse and produces a flux which tends to cancel the flux resulting from the current through the first primary winding; whereby a high voltage output pulse is produced across the secondary of the transformer which accurately reproduces the duration of the applied low voltage control pulse signal.

The first current gating means includes a circuit arrangement for responding to the leading edge of the applied control signal pulse for commencing the application of the first current; positive feedback means responsive to the first current for providing a short rise time for said current and for continuing the application thereof following the leading edge of the control pulse; and negative feedback means responsive to the second current for terminating the first current upon the occurrence of the trailing edge of the control signal pulse.

In the herein disclosed embodiment the feedback means includes a second current transformer having its secondary winding coupled to the control element of the first current gating means and having first and second primary leads coupled such that the first current flows through the first primary winding and the second current flows through the second primary winding. The windings of the second transformer are so oriented that the first current produces positive feedback to the control element of the first current gating means, and the second current produces negative feedback. The magnitudes of these positive and negative feedback signals are such that when both are present the flow of the first current is interrupted.

BRIEF DESCRIPTION OF THE DRAWINGS

The novel features of the subject invention, as well as the invention itself, will be better understood from the accompanying description in which:

FIG. 1 is a block and schematic diagram of a pulse modulator in accordance with the principles of the subject invention; and FIG. 2 is a perspective view of a current transformer suitable for use as the output transformer of the pulse modulator shown in FIG. 1.

DETAILED DESCRIPTION OF THE PREFERRED EMBODIMENT

Reference is first directed to FIG. 1 which shows in block diagram form an embodiment of the subject invention which is adapted for responding to a low voltage control signal pulse applied from a radar signal processor 10 (see waveform 11) and for producing a high voltage signal at the grid 12 of a TWT circuit 14. For example, the control signal pulse of waveform 11 may be 5 volts in amplitude and from 0.1 microseconds to 10 microseconds in duration; while the output pulse applied at grid 14 of the TWT may be 800 volts in magnitude and of substantially the same duration and shape as the applied control signal pulse.

Current transformer 16 has a first primary lead 18, a second primary lead 20 and a secondary winding 22. In the quiescent state vacuum tubes 28 and 30 are biased to cut-off by power supply 54, and therefore are not conducting. Transistors 36, 46 and 48 are not conducting. The TWT 14 is biased beyond cut-off by power supply 24 and is therefore not conducting.

A first current gating circuit which includes vacuum tube 28 controls the flow of a current $I_1$ in primary lead 18; and a second current gating circuit which includes a vacuum tube 30 controls the flow of a current $I_2$ in primary lead 20.

The control signal pulse (see waveform 11) is differentiated by a circuit which includes a capacitor 32 (see waveform 34). The negative spike resulting from the leading edge of the differentiated control signal pulse causes transistor 36 to conduct, resulting in reduced bias on the grid (control element) of tube 28 causing the flow of current $I_1$ to commence.

A transformer 38 has first and second primary leads with a first of these leads, designated by the reference numeral 40, being coupled in the cathode circuit of tube 28. The secondary winding of transformer 38 is coupled to the grid of tube 28 with the polarity of the transformer being such that positive feedback of current $I_1$ is implemented, i.e. an increase in value of current $I_1$ provides an increasing positive voltage at the grid of tube 28.

The circuit parameters affecting the value of the current $I_1$ are selected so that a substantially constant amplitude high voltage pulse will be produced across the secondary of transformer 16. During the positive pulse output the TWT will conduct.

The control signal pulse (see waveform 11) is also differentiated by the circuit which includes capacitor 44 and is amplified by the circuit which includes transistors 46 and 48. The amplified output signal from transistor 48 is applied to the control grid of tube 30 and the positive spike thereof, which is coincident with the trailing edge of the control signal pulse causes the flow of current $I_2$ to commence.

The current $I_2$ flows in primary lead 20 of transformer 16 in a direction opposite to that of the current $I_1$ in primary lead 18 and therefore the flux resulting from the current $I_2$ is in opposition to the flux produced by the current $I_1$. Upon initiation of the current $I_2$ the output pulse across secondary 26 of transformer 16 very rapidly switches to zero.

The current $I_2$ also flows through the second primary lead 50 of transformer 38 and its direction is opposite from that of the current $I_1$ which flows in the other primary lead 40. Similar to the operation of transformer 16 explained hereinabove, in transformer 38 the flux resulting from the current $I_2$ cancels the flux from current $I_1$ such that the voltage across the secondary winding changes from a positive value to a negative voltage. This change in voltage to the grid of tube 28 rapidly terminates the flow of the current $I_1$.

A transformer 52 has its primary lead coupled in the cathode circuit of tube 30 and its secondary winding coupled to the control grid of said tube. The polarity of the transformer winding is such that an increasing value of current $I_2$ produces an increasing positive voltage at the control grid. The parameters of the circuit which produces current $I_2$ are such that its rate of change and magnitude are sufficient to cause the pulse applied to the grid of TWT 14 to swing very rapidly to zero. Also, the current $I_2$ is sufficient to produce a voltage across winding 40 of transformer 38 of such a level as to rapidly stop the flow of current $I_1$. Following the just described functions performed by current $I_2$, transformer 52 saturates and the grid of tube 30 is biased to a negative potential by source 54. This in turn stops the flow of current $I_2$ and returns the circuit of FIG. 1 to a standby state ready to process the next control signal pulse applied from signal processor 10.

Output transformer 16 is shown in FIG. 2 to which reference is now momentarily directed. As shown core 17 of the transformer is toroidal in shape and may be primarily comprised of ferrous material. Secondary winding 26 is wound around core 17 and primary leads 18 and 20 pass through the center of the toroidal core. The considerable distances between the primary leads and the secondary winding allows the high potential difference to exist therebetween without arcing. The design of transformer 16 is similar to that of instrumentation type transformers such as those used to permit oscilloscope viewing of current pulses in a wire that is at a potential of up to a hundred thousand volts with respect to ground.

Again referring primarily to FIG. 1 for the purpose of reviewing and summarizing the operation of the modulator there shown, prior to the application of a control signal pulse from processor 10 the circuit is in its quiescent state and neither tube 28 nor tube 30 is conducting. Upon the application of a control signal pulse (see waveform 11) the differentiated leading edge of the pulse turns on transistor 36 which in turn causes tube 28 to start conducting current $I_1$. The cathode current of tube 28 passes through current transformer 38 and induces a positive voltage in its secondary which is impressed upon the control grid of the tube 28.

The positive voltage applied to the grid of tube 28 causes PNP transistor 36 to cease conducting. The positive feedback voltage on the grid of tube 28 causes an increase in the current $I_1$ which in turn increases the positive voltage impressed upon the grid of that tube. This regenerative action causes the plate current of tube 28 to rise to a high value in an extremely short time. The plate current of tube 28 passing through the primary lead 18 of transformer 16 induces a high voltage across the secondary winding 26 which winding is coupled across the grid of TWT 14.

Current transformer 38 in the cathode circuit of tube 28 is designed so that it sustains the positive pulse on the grid of tube 28, i.e. it does not saturate, for a length of time equal to the widest pulse specified for the particular application in which the pulse modulator is to be used.

Continuing with the summary of the operation of the circuit of FIG. 1, the differentiated trailing edge of the control signal pulse causes tube 30 to start conducting current $I_2$. The regenerative action of transformer 52 causes the plate current of tube 30 to rise to a high value in an extremely short time. The plate and cathode currents of tube 30 pass through transformers 16 and 38, respectively, in a reverse direction to the current from tube 28. The resultant flux cancellation which takes place in said transformers bring the trailing edge of the output pulse from transformer 16 to zero very rapidly since tube 28 is driven towards cutoff by reverse regenerative action of transformer 38 and the effects of the current from tube 28 flowing through transformer 16 is canceled by the reverse current applied from tube 30. The peak value of the output signal of transformer 16 is determined by the winding ratio of the transformer as well as the peak value of the current $I_1$.

It is noted that in pulse modulators in accordance with the subject invention that the only part of the modulator circuit at the high potential of the TWT is the secondary and core of transformer 16 and this configuration allows for a considerable increase in reliability. Also, the positive feedback arrangement implemented by transformer 38 allows for an extremely fast rise time of the output pulse and the degenerative effect of current $I_2$ flowing through transformers 16 and 38 allows for an extremely fast fall time of the output pulse. Hence, the subject invention provides for faithful reproduction at an extremely high potential level with respect to ground of an applied control signal pulse at ground level by means of a circuit which is less complex but more reliable than prior art circuits known to Applicant.

Thus, having described a new and improved pulse modulator, what is claimed is:

1. A pulse modulator for applying a pulse of energy to a load circuit during the duration of an applied control signal pulse, said pulse modulator comprising:
   a transformer having a secondary winding adapted for being coupled across said load circuit, and first and second primary elements;
   first means for applying a first current through the first primary element of said transformer during the duration of said control signal pulse;
   second means for applying a second current through the second primary element of said transformer so as to produce a flux which is in opposition to the flux resulting from the current through said first primary element and such that said second current through the second primary winding commences with the trailing edge of said control signal pulse; and
   wherein said first means includes a circuit arrangement having current gating means for responding to the leading edge of said control signal pulse for commencing the application of said first current, positive feedback means responsive to the said first current for increasing the value thereof, and negative feedback means responsive to said second current for terminating the flow of said first current;
   whereby an output pulse is produced across the secondary winding during the duration of said control pulse signal.

2. The pulse modulator of claim 1 wherein said positive feedback means includes a second transformer having a secondary winding, and first and second primary elements; and wherein said first primary element is coupled such that said first current is conducted therethrough, and said second primary element is oriented and said second current is coupled therethrough so as to produce a flux in opposition to the flux resulting from the current in said first element; and wherein said secondary transformer winding is coupled to the control element of said current gating means such that said first current produces positive feedback and said second current produces negative feedback.

3. The pulse modulator of claim 2 wherein said second means includes a circuit arrangement having second current gating means for responding to the trailing edge of said control signal pulse for commencing the application of said second current and second positive feedback means which is responsive to said second current for continuing the application thereof following the trailing edge of said control signal pulse.

4. The pulse modulator of claim 3 wherein said second positive feedback means includes a third current transformer having a secondary winding coupled to the control element of said second current gating means and a primary element coupled so that said second current is conducted therethrough in a direction for producing positive feedback to the control element of said second current gating means.

5. The pulse modulator of claim 4 wherein said third transformer is of a type which saturates at a preselected value of said second current; whereby upon saturation of said third transformer the positive feedback to said second current gating means is removed and said second current is terminated.

6. A pulse modulator for applying a high voltage pulse of energy to a load circuit during a period defined by a low voltage applied control signal pulse, said pulse modulator comprising:
   an output transformer having a secondary winding adapted for being coupled across said load circuit, and first and second primary leads;
   first means for applying a first current through the first primary lead of said output transformer during the duration of said control signal pulse;
   second means for applying a second current through the second primary lead of said output transformer so as to produce a flux which is opposition to the flux resulting from said first current, said second means includes means for commencing said second current flow upon the occurrence of the trailing edge of said control signal pulse; and
   wherein said first means includes current gating means for commencing the flow of first current upon the leading edge of said control signal pulse, positive feedback means responsive to said first current for increasing the value thereof and negative feedback means responsive to said second current for terminating the flow of said first current; whereby a high voltage output pulse is produced across the secondary winding of said output transformer during the duration of said control pulse signal.

7. The pulse modulator of claim 6 wherein said positive and negative feedback means includes a second transformer having a secondary winding and first and second primary leads, and wherein said first primary lead is coupled such that said first current is conducted therethrough, and said second primary lead is oriented and said second current is coupled therethrough so as to produce a flux in opposition to the flux resulting from the current in said first element, and wherein the secondary winding of said second transformer is coupled to the control element of said current gating means such that said first current produces positive feedback and said second current produces negative feedback.

8. The pulse modulator of claim 7 wherein said second means includes a circuit arrangement having second current gating means for responding to the trailing edge of said control signal pulse for commencing the application of said second current and second positive feedback means which is responsive to said second current for continuing the application thereof following the trailing edge of said control signal pulse.

9. The pulse modulator of claim 8 wherein said second positive feedback means includes a third current transformer having a secondary winding coupled to the control element of said second current gating means and a primary lead coupled so that said second current is conducted therethrough in a direction for producing positive feedback to the control element of said second current gating means.

10. The pulse modulation of claim 6 wherein said output transformer is a current transformer.

* * * * *